US009658254B2

(12) United States Patent
Ramirez

(10) Patent No.: US 9,658,254 B2
(45) Date of Patent: May 23, 2017

(54) MAGNETIC TAMPERING DETECTION IN A UTILITY METER

(71) Applicant: Landis+Gyr, Inc., Lafayette, IN (US)

(72) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 519 days.

(21) Appl. No.: 13/931,354

(22) Filed: Jun. 28, 2013

(65) Prior Publication Data

US 2015/0002134 A1   Jan. 1, 2015

(51) Int. Cl.
 *G01R 11/24* (2006.01)
 *G01R 22/06* (2006.01)
 *G01D 4/00* (2006.01)

(52) U.S. Cl.
 CPC ............ *G01R 11/24* (2013.01); *G01R 22/066* (2013.01); *G01D 4/00* (2013.01)

(58) Field of Classification Search
 CPC .... G01R 11/24; G01R 22/061; G01R 22/063; G01R 22/065; G01R 22/066; G01R 22/068; G01D 4/00; G01D 4/002
 See application file for complete search history.

(56) References Cited

U.S. PATENT DOCUMENTS

| | | | | |
|---|---|---|---|---|
| 5,910,774 A * | 6/1999 | Capriotti | ............... | G01F 15/007 324/110 |
| 5,936,834 A * | 8/1999 | Polston | ............... | H02B 1/20 361/660 |
| 6,414,475 B1 * | 7/2002 | Dames | ............... | G01R 15/18 324/127 |
| 7,218,223 B2 * | 5/2007 | Seal | ............... | G01R 22/066 324/110 |
| 7,432,823 B2 * | 10/2008 | Soni | ............... | 340/870.02 |
| 7,495,555 B2 | 2/2009 | Seal | | |
| 2003/0151415 A1 * | 8/2003 | Randall | ............... | G01R 35/04 324/601 |
| 2004/0021568 A1 * | 2/2004 | Seal et al. | ............... | 340/551 |

(Continued)

OTHER PUBLICATIONS

Government of Arunachal Pradesh Department of Power: Bid Document Part-III (vol. 2/3); Automation of Electric Energy Metering and Billing With AMR and Pre-Paid Meters in Capital Complex 11, XP055148020, Jun. 27, 2013, pp. 1-86.

(Continued)

*Primary Examiner* — Huy Q Phan
*Assistant Examiner* — David Frederiksen
(74) *Attorney, Agent, or Firm* — Maginot Moore & Beck LLP

(57) ABSTRACT

A method of detecting a magnetic coupling in a meter includes obtaining in an electricity meter information representative of power consumption as measured within the meter of a plurality of lines of an electrical service. The method also includes obtaining from a magnetic sensor information representative of a magnetic field within an electricity meter. A processing circuit then determines whether a first condition exists wherein the magnetic field exceeds a first threshold and the information representative of the power consumption indicates a load imbalance on the plurality of lines such that the load imbalance exceeds an imbalance threshold. The method further includes performing a processing step responsive to a determination that the first condition exists.

20 Claims, 3 Drawing Sheets

(56) References Cited

U.S. PATENT DOCUMENTS

| | | | |
|---|---|---|---|
| 2008/0109387 A1* | 5/2008 | Deaver | G01R 19/16547 705/412 |
| 2010/0036624 A1* | 2/2010 | Martin et al. | 702/61 |
| 2010/0134089 A1* | 6/2010 | Uram | G01R 22/063 324/66 |
| 2011/0025519 A1* | 2/2011 | Donaldson | H04L 67/125 340/664 |
| 2012/0026715 A1* | 2/2012 | Manion | H01R 4/64 361/816 |
| 2012/0078428 A1* | 3/2012 | Henderieckx | H02J 3/26 700/292 |
| 2012/0078546 A1* | 3/2012 | Mancuso et al. | 702/61 |
| 2012/0092177 A1* | 4/2012 | Kuystermans | G01R 22/066 340/635 |
| 2012/0130681 A1* | 5/2012 | Pride | 702/189 |
| 2013/0063280 A1* | 3/2013 | Pamulaparthy | H02J 3/26 340/870.09 |
| 2013/0088353 A1* | 4/2013 | LaFrance | 340/551 |
| 2013/0093418 A1 | 4/2013 | Ramirez | |

OTHER PUBLICATIONS

Bhutan Power Corporation Limited: Addendum 211, XP055148039, Aug. 2011, pp. 1-13, http://www.bpc.bt/wp-content/downloads/2011/B20/Addendum2.pdf.

Glenn A. Pritchard, Analytics in Action, Metering International, XP002731435, Oct. 2012, pp. 120-124, http://www.metering.com/wp-content/uploads/2013/10/MI-3-2012a.pdf.

Rajesh M Bansal, Maximizing the Benefits of AMR for Theft Detection Through Data Analytics, XP055148045, Jul. 2007, pp. 1-33, http://www.metering.com/wp-content/uploads/RajeshFINALO.pdf.

International Search Report for PCT Patent Application No. PCT/US2014/044753, Nov. 7, 2014.

\* cited by examiner

MAGNETIC TAMPERING DETECTION IN A UTILITY METER

FIELD OF THE INVENTION

The present invention relates generally to utility meters, and particularly, to utility meters that can be affected by magnetic fields.

BACKGROUND

Electrical service providers such as electrical utilities employ electricity meters to monitor energy consumption by customers (or other entities). Electricity meters track the amount of energy consumed by a load (e.g. the customer), typically measured in kilowatt-hours ("kwh"), at each customer's facility. The service provider uses the consumption information primarily for billing, but also for resource allocation forecasting and other purposes.

Electricity meter tampering is a form of energy theft that can have significant impact on costs for utilities and paying customers. Electricity meter tampering typically involves modification of the meter to bypass, alter or disconnect the consumption metering function of the meter, such that less than all of the actual energy consumption is registered.

An emerging type of meter tampering involves the use of a high power magnet. In particular, electricity meters using standard current transformers ("CTs") are susceptible to tampering using high-power magnetics. To this end, the CT current sensor behavior can be impacted if a large magnet such as a neodymium iron boron magnet (sometimes referred to as a rare earth magnet) is placed in close proximity. The high intensity magnetic field will result in an error in sensing current and potentially a significant under-registration of (and consequent underbilling for) energy consumed.

To combat this issue, it has been known to place a ferromagnetic shielding structure around the CT or the entire interior of the meter to reduce the impact of the magnetic field on interior components. However, magnetic shielding requires additional material, a careful design to meet high voltage insulation requirements and labor cost, and undesirably increases the cost, manufacturability complexity and weight of the meter.

It is also known to employ a magnetic sensor to detect and flag a potential tampering situation. See U.S. Patent Publication No. 2010/0072990 and U.S. Pat. No. 7,495,555 for examples of this method. In at least some prior art devices, a Hall Effect sensor is used to detect placement of a magnet that could be due to tampering.

One drawback of many prior art meters that employ magnetic sensors is the need to distinguish magnetic signals associated with legitimate activity from those associated with intentional or unintentional tampering. For example, it is known to use a permanent magnet switch to provide rudimentary input to a meter in order to obtain displays of different values. It is also known to use magnets to hold external communication probes to a meter optical port. Both uses are legitimate, and typically do not alter the energy measurement in an appreciable manner.

One method of distinguishing legitimate uses of magnetic fields from illicit uses of magnetic fields is to set a threshold for detected magnetic fields that exceeds those normally encountered in legitimate uses. Thus, very high magnetic fields often indicative of tampering will cause the meter to record, display and/or communicate a potential tamper situation, while lower magnetic fields often associated with communication probes and magnetic switch inputs are ignored. A drawback to this approach is that at least some true tampering situations will not cause a detected magnetic field that exceeds the threshold. These tampering situations can result in energy metering inaccuracy that can persist for long periods of time.

There is a need, therefore, for a more cost-effective approach to combating meter tampering that further reduces the revenue lost due to tampering or other magnetic field-induced inaccuracy.

SUMMARY OF THE INVENTION

The present invention address the above described needs, as well as others by determining whether an unauthorized or extraneous magnetic field exists by combining the detection of a lower magnetic field threshold with a measured load imbalance. By additionally detecting the load imbalance, lower magnetic fields that can be associated with legitimate uses can be distinguished from lower magnetic fields caused by tampering. Even if the cause of the lower magnetic field cannot be specifically identified, the embodiments described herein distinguish lower magnetic fields that nevertheless affect metering accuracy.

A first embodiment is a method of detecting a magnetic coupling in a meter. The method includes obtaining in an electricity meter information representative of power consumption as measured within the meter of a plurality of lines of an electrical service. The method also includes obtaining from a magnetic sensor information representative of a magnetic field within an electricity meter. A processing circuit then determines whether a first condition exists wherein the magnetic field exceeds a first threshold and the information representative of the power consumption indicates a load imbalance on the plurality of lines such that the load imbalance exceeds an imbalance threshold. The method further includes performing a processing step responsive to a determination that the first condition exists.

Another embodiment is a circuit for use in an electricity meter that includes a metrology circuit, a magnetic sensor, and a processing circuit. The metrology circuit is configured to obtain information representative of a load on a plurality of lines of an electrical service. The magnetic sensor is configured to provide information representative of a magnetic field within an electricity meter. The processing circuit is operably coupled to the magnetic sensor. The processing circuit configured to determine whether a first condition exists wherein the magnetic field exceeds a first threshold and the information representative of the load indicates a load imbalance on the plurality of lines such that the load imbalance exceeds an imbalance threshold. The processing circuit is further configured to perform a processing step responsive to a determination that the first condition exists.

The above described features and advantages, as well as others, will become more readily apparent to those of ordinary skill in the art by reference to the following detailed description and the accompanying drawings.

DETAILED DESCRIPTION

Figure 1:
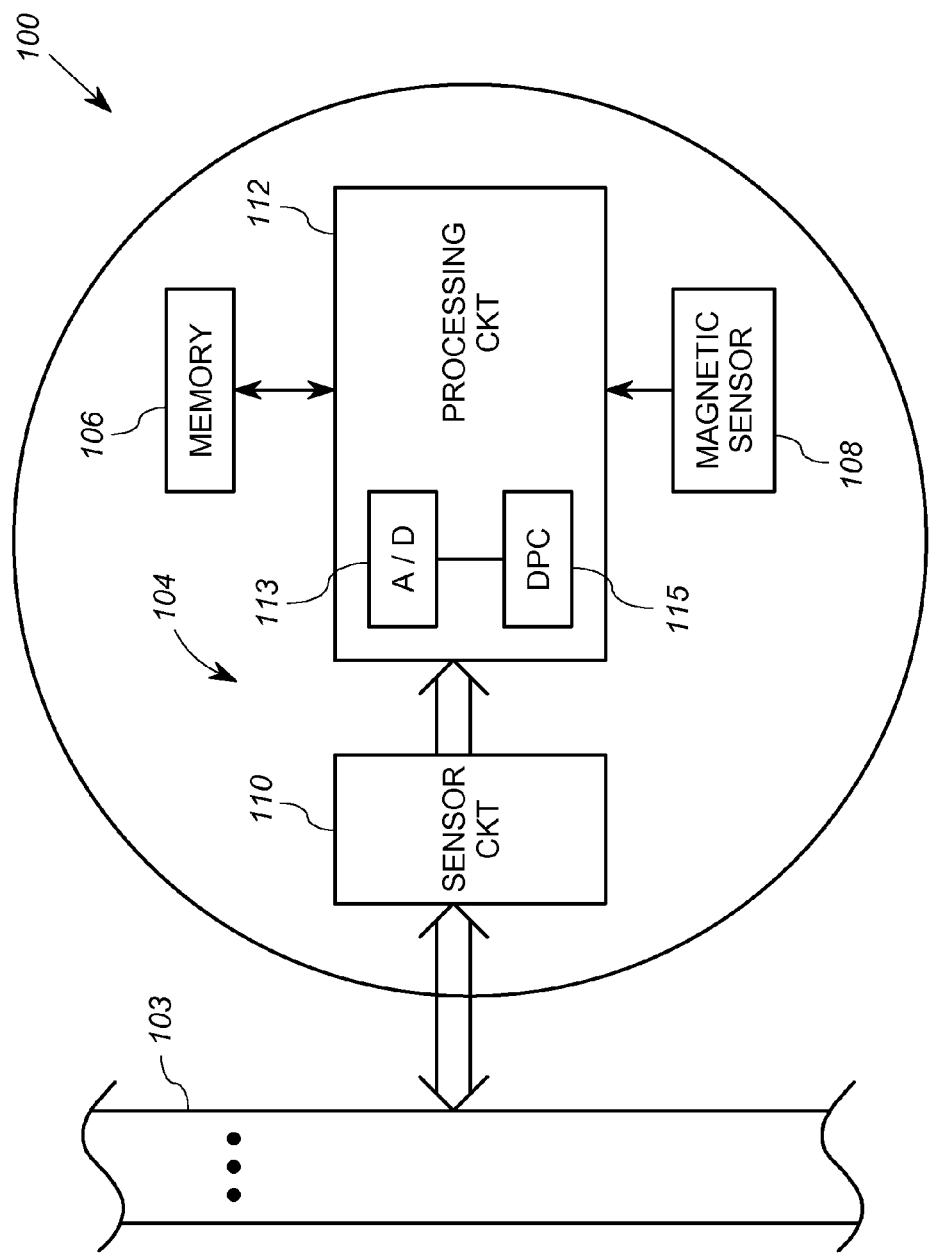
FIG. 1 shows a schematic block diagram of an exemplary embodiment of an electricity meter having a circuit for detecting a magnetic event.

FIG. 1 shows a schematic block diagram of an electricity meter 100 having a circuit for detecting a magnetic event. In this embodiment, a magnetic event is a condition in which the electricity meter 100 is exposed to a magnetic field that has a high likelihood of affecting metering accuracy, and/or is likely the result of an attempt to tamper with the meter by placing a permanent magnet on or in the proximity of the meter 100. A magnetic event typically requires corrective action. Notification of a magnetic event can allow for timely correction.

The electricity meter 100 includes a meter housing 102, which supports a metrology circuit 104, a memory 106, a magnetic sensor 108, and a processing circuit 112. The processing circuit 112 may suitably also form part of the metrology circuit 104.

The metrology circuit 104 is any suitable circuit that is configured to detect electricity delivered to the metered load, not shown in FIG. 1, and generate power consumption information therefrom. To this end, the metrology circuit 104 is operably coupled to detect voltage and current delivered to the load on each of a plurality of lines 103 of the electrical service. The electrical service may be a polyphase service, such as a four-wire wye, three-wire delta or other known polyphase service, or a single phase residential service with a neutral defined between the upper and lower lines of the service. Such services are well-known, as are metrology circuits capable of detecting voltage and current on the power lines 103 thereof.

In this embodiment, the metrology circuit 104 generates power consumption information that includes both the overall energy consumption by the load, and at least a current measurement value for each power line (i.e. per phase, or both "hot" lines of a split single phase service) of the electrical service. However, it will be appreciated that the metrology circuit 104 may generate many power consumption related values, such as real energy, reactive energy, apparent energy, power factor, RMS voltage per phase or line, RMS current per line or power consumption information that includes a power consumption value for each phase or power line.

Figure 2:
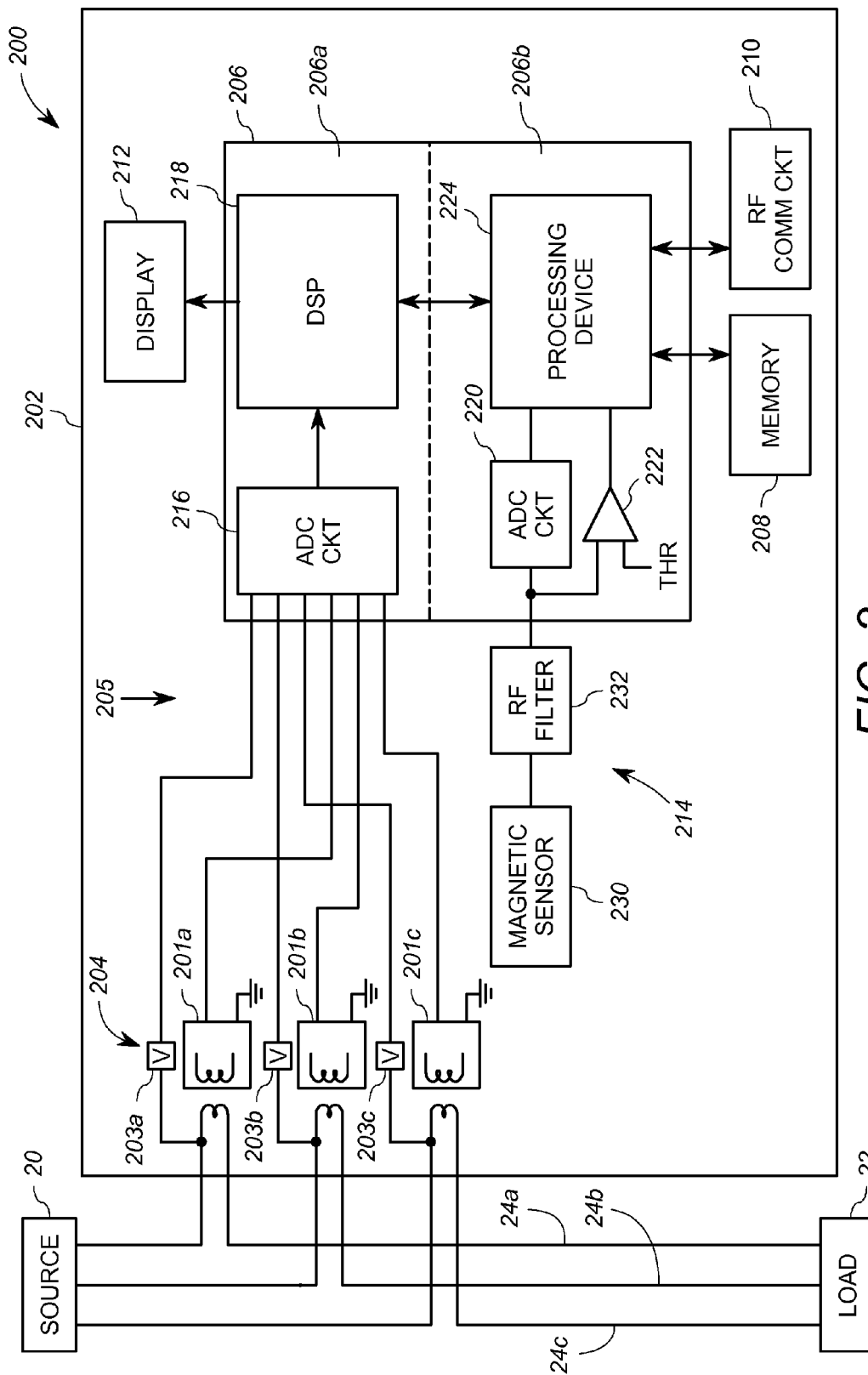
FIG. 2 shows a schematic block diagram of another exemplary embodiment of an electricity meter having a circuit for detecting a magnetic event.

In this embodiment, the metrology circuit 104 includes a sensor circuit 110 and at least some of the functions of the processing circuit 112. The sensor circuit 110 in this embodiment includes voltage sensors and current sensors, not shown in FIG. 1, which sense electricity delivered to the load, and generate analog electricity measurement signals therefrom. The processing circuit 112 includes analog-to-digital conversion (ADC) circuitry 113 that converts the analog electricity measurement signals to digital measurement signals, and digital processing circuitry 115 that calculates various energy-consumption related values based on the digital measurement signals. Such circuits in many forms are well known in the art. FIG. 2, discussed below, shows in further detail a non-limiting exemplary embodiment of a metrology circuit for an electricity meter.

The memory 106 in this embodiment is representative of non-volatile memory, such as flash memory or the like. However, it will be appreciated that the memory 106 may also other non-volatile memory, or even volatile memory. The processing circuit 112 also includes working memory, such as RAM, as is known in the art.

The magnetic sensor 108 is a device or set of devices that are configured to detect, and provide information representative of, a magnetic field within the electricity meter 100. More specifically, the magnetic sensor 108 is configured to measure a magnetic field in proximity to the sensor circuit 110, and preferably a current sensor thereof. The magnetic sensor 108 is further configured to generate a magnetic measurement signal representative of, at least in part, a magnitude of the magnetic field. In accordance with a first exemplary embodiment, the magnetic sensor 108 is a Hall-effect sensor. In other embodiments, the magnetic sensor 108 may be a GMR ("giant magnetic resistance") sensor. As will be discussed below in detail, the magnetic sensor 108 may be operably connected to the ADC circuit 113 or other input of the processing circuit 112 via an RF filter, not shown in FIG. 1.

In addition to the operations as part of the metrology circuit 104, the processing circuit 112 is operably coupled to receive the magnetic measurement signal from the magnetic sensor 108. The processing circuit 112 is further configured to determine whether a first condition exists wherein the magnetic field exceeds a first threshold and the information representative of the power consumption as measured by the metrology circuit 104 indicates a load imbalance on the plurality of lines such that the load imbalance exceeds an imbalance threshold. It will be appreciated that the information representative of the power consumption may not be the same in some cases as the actual power consumption, such as when the meter 100 is the subject of magnetic tampering.

To this end, the processing circuit 112 is configured to determine whether the magnetic field as measured by the magnetic sensor 108 exceeds a first threshold. The first threshold may suitably be 10 Gauss. However, it will be appreciated that lower or higher values may be appropriate or desirable in other embodiments.

The processing circuit 112 is also configured to determine whether the power consumption as measured by the metrology circuit 104 indicates a load imbalance among the plurality of power lines 103, based on power consumption information received from the metrology circuit 104. In this embodiment, the processing circuit 112 determines a load imbalance value by determining the difference of the power consumption value on the different power lines 103. For example, the processing circuit 112 may suitably compare the RMS current on each of the lines or phases 103 of the electrical service. The largest difference between any two lines comprises the load imbalance value. In other embodiments, the processing circuit 112 may determine the VA or real energy on each of the power lines 103, and then determine largest difference in such values among the lines and phases.

Referring again to the specific embodiment of FIG. 1, the processing circuit 112 is configured to determine that a first condition exists, in other words, a magnetic event (e.g. a tamper condition or other magnetic abnormality) if the load imbalance value exceeds an imbalance threshold and the magnetic field exceeds the first threshold. The load imbalance threshold may suitably be 20% in a polyphase system or 40% in a single phase system. The processing circuit 112 is further configured to perform a processing step responsive to a determination that the magnetic event or the first condition, exists. The processing step can include storing a tamper indication or flag to the memory 106 or another memory, causing the display of a tamper indication on a display, not shown, which may be on the meter 100 or on another device. The processing step can also involve causing communication of the tamper indication to a remote device via a communication circuit, not shown, but which may be included in or attached to the meter 100.

In the embodiment described herein, the processing circuit 112 is further configured to determine that a magnetic event exists if the magnetic field exceeds a higher second threshold, regardless of whether a load imbalance exists. The processing circuit 112 is configured to store, display or communicate the tamper indication information responsive to the magnetic field exceeding the second threshold independent of any determination of load imbalance. For example, if the magnetic field exceeds that which may be generated by legitimate means, such as through use of a reed switch or attachment of an optical probe, then the processing circuit 112 is configured to generate a tamper indication without regard to measured load imbalance.

In operation, electrical power is delivered to the load via a plurality of power lines 103. The metrology circuit 104 detects the electrical power and generates power consumption information related thereto. In this embodiment, the metrology circuit 104 generates accumulated energy consumption information in any conventional manner, and further generates a per-phase or per-line current measurement, such as an RMS current value for each line or phase of the electrical service. The processing circuit 112 may suitably store or cause display of energy consumption information.

Contemporaneously and periodically, the magnetic sensor 108 generates magnetic field measurement signal and provides the signal to the processing circuit 112. The processing circuit 112 generates information representative of the magnetic field based on the magnetic field measurement signal. For example, the processing circuit 112 may periodically sample and digitize the magnetic field measurement signal. In other embodiments, the magnetic sensor 108 may be part of a chip package or circuit that generates digital values representative of the measured magnetic field.

The processing circuit 112 also determines periodically the load imbalance value as discussed above. The load imbalance value may suitably be the percentage difference between any two of the per-phase or per-line current measurement values at a moment in time.

The processing circuit 112 then determines whether a first condition exists wherein the magnetic field exceeds the first threshold and the load imbalance value exceeds an imbalance threshold. If so, then the processing circuit 112 stores a tamper or magnetic abnormality indication in the memory 106 or other memory, causes display of the indication on a meter display, and/or causes communication of the indication to an external device. The processing circuit 112 also determines whether the magnetic field exceeds the second threshold. If so, then the processing circuit 112 stores, displays or communicates the indication as discussed above.

FIG. 2 shows in further detail an exemplary meter 200 that incorporates a magnetic event or magnetic abnormality detection arrangement similar to that of FIG. 1. It will be appreciated that the one or more inventive aspects described herein may be implemented in many configurations of electricity meters, and is not limited to one having the specific architecture of the meter in FIG. 2.

In general, the meter 200 is configured to measure/meter energy consumption (and/or other energy consumption related values) based on electricity delivered from a source 20 (e.g. a utility service provider) to a load 22 (a residential, commercial or other customer site). In the example of FIG. 2, the source 20 delivers electricity to the load 22 in three power lines 24a, 24b and 24c in a three-phase electrical service, as is known in the art. Phase A voltage is delivered on phase voltage line 24a, phase B voltage is delivered on phase voltage line 24b, and phase C voltage is delivered on phase voltage line 24c. Various methods of providing three phase electrical service to a customer load are known in the art.

Referring to FIG. 2, the meter 200 includes a housing 202 in which are disposed a sensor circuit 204, a processing circuit 206, a non-volatile memory 208, a communication circuit 210, a display 212, and a magnetic sensor circuit 214. The housing 202 is a conventional electricity meter housing that provides protection from the elements and protection from certain forms of meter tampering.

In this embodiment, the processing circuit 206 includes two integrated circuit packages 206a and 206b. The integrated circuit package 206a includes an analog-to-digital conversion (ADC) circuit 216 and a digital signal processing circuit ("DSP") 218. In this embodiment, the sensor circuit 204 and the integrated circuit package 206a form a metrology circuit 205 of the meter 200. To this end, the ADC circuit 216 is operably coupled to the sensor circuit 204 to receive analog voltage and current measurement signals representative of the voltage and current on the phase A, B and C lines 24a, 24b and 24c, and to generate sampled versions thereof. As will be discussed below, the DSP 218 is configured to receive the sampled measurement signals and generate therefrom various power consumption values, including energy consumption values and per-phase current measurement values. The per-phase current measurement values may suitably be per-phase RMS current values, or per-phase peak current values. In this embodiment, the integrated circuit package 206a is a Teridian metering IC such as the mo71M6533.

The second integrated chip package 206b also includes an ADC circuit 220, an interrupt circuit 222, and a processing device 224. The second integrated chip package 206b may suitably be the model PIC32MX360 32-bit processor available from Microchip. The interrupt circuit 222 in this embodiment is a circuit configured to generate an interrupt signal to cause the processing device 224 to perform a tamper detection routine, as will be discussed below, when the interrupt circuit 222 receives a voltage level exceeding a programmable or configurable threshold. The ADC circuit 220 is configured to digitize input signals and provide the digitized signals to the processing circuit 224. The processing device 224 is configured to, among other things, perform a tamper detection routine upon receiving an interrupt from the interrupt circuit 220. To this end, the processing circuit 224 is coupled to receive magnetic sensor information from the ADC circuit 220 and per-phase current measurement information from the DSP 218. The processing device 224 may also be configured to control communications via the communication circuit 210, and/or store an energy consumption load profile and other values in the memory 208.

It will be appreciated that the devices of the integrated circuit packages 206a, 206b may be configured in any number of suitable ways and need not be integrated into two chip packages. For example, the devices of the packages 206a, 206b may instead be formed partly or completely of discrete components. It will further be appreciated that the operations of the processing circuits 218 and 224 may be combined into a single processing device, or split differently than described herein. The ADC circuits 216 and 220 may similarly be configured in any suitable manner. The use of the particular arrangement of integrated circuit packages 206a, 206b in this embodiment allows for consistency in metrology circuit topologies across various metering platforms. For example, simple meters requiring only the functionality of the integrated circuit package 206a may share much of the same hardware design and specifications as complex meters requiring multiple processing devices.

Referring again specifically to FIG. 2, the sensor circuit 204 includes circuits that are configured to generate voltage and current measurement signals that are representative of the voltage and current on phase A, phase B and phase C voltage lines 24a, 24b and 24c. The voltage and current magnitude signals are signals of much lower magnitude than the line voltage. Suitable sensor circuits are well-known in the art. For example, the current sensors may suitably include current transformers 201a, 201b, 201c, which are operably coupled to the ADC circuit 216.

In this embodiment, the voltage sensors include the three voltage sensors 203a, 203b and 203c, which may suitably comprise voltage dividers. The voltage sensor 203a is operably coupled to the phase A power line 24a, the voltage sensor 203b is operably coupled to the phase B power line 24b, and the voltage sensor 203c is operably coupled to the phase C power line 24c. The voltage sensors 203a, 203b, 203c are also coupled to inputs of the ADC circuit 216.

The ADC circuit 216 is operably coupled to provide digital voltage and current measurement samples to the DSP 218. The DSP 218 is configured to generate energy measurement values from the voltage and current measurement signals. The DSP 218 is further configured to cause the display of such values on the display 212. The generated energy measurement values may suitably include values representative accumulated real power, RMS current, RMS voltage, and other values. In this embodiment, the DSP 218 furthermore generates per-phase current magnitude values as a measure of the load on each of the phase power lines 24a, 24b, 24c. The DSP 218 is operably coupled to provide the per-phase current magnitude values to the processing device 224. It will be appreciated, however, that the DSP 218 could instead provide other measures of the load on each of the phase power lines such as [per-phase VAR, VA or Watts)—can these values be used to determine tamper-related load imbalance???]

The processing device 224 is operably coupled to per-phase power consumption information (e.g. per-phase current magnitude) from the DSP 218. The processing device 224 may also be coupled to receive other energy measurement values from the DSP 218. To this end, the processing device 224 is configured in some cases to further process the energy measurement values to generate power quality information and/or store load profiling information. Such operations are known may take many forms. The processing device 224 is further configured to control various operations, such as those that transmit values using the transmitter 210, and storing of values in the non-volatile memory 208.

The transmitter 210 is a circuit configured to transmit meter data, under the control of the processing device 224, to a remote device, not shown. As is known in the art, the transmitter 210 can be used to provide automated meter reading ("AMR") operations. AMR operations allow the utility service provider to obtain consumption and/or billing information from the meter 200 from a remote location, thereby eliminating the need for personnel that travel to the meters to obtain such data. In addition, the transmitter 210 can be used to transmit information indicating the loss of power to the meter 200 in a so-called "last gasp" transmission. The last gasp transmission informs the utility service provider that the meter 200 is losing power, which could be the result of a service outage, or due to tampering with the meter 200. As will be discussed below, the transmitter 210 may be configured to transmit a signal indicative of a magnetic event, including a date and time stamp corresponding to the time when the event was detected.

The display 212 is any suitable meter display. Typically, the display 212 is a segmented LCD display, but other displays may be employed.

The magnetic sensor circuit 214 in the embodiment described herein comprises a magnetic sensor 230 and an RF filter 232. The magnetic sensor 230 is a device that is configured to detect a magnetic field and generate an electrical signal, or sensor signal, that has a characteristic that is representative of the measured magnetic field. In the embodiment described herein, the magnetic sensor 230 is a Hall-effect sensor. The RF filter 232 is a filter configured to filter out high frequency signals associated with radio frequency communications or other radio frequency emissions. In particular, the magnetic event detection arrangement discussed herein is intended to detect a steady state, static, magnetic field, as opposed to those associate with RF signals. The RF filter 232 is included to eliminate from the sensor signal magnetic fields associated with periodic or high frequency signals. The RF filter 232 is operably connected to provide the filtered sensor signal to the interrupt circuit 222.

In the operation of the meter 200, the source 20 provides electrical power to the load 22 via the power lines 24a, 24b and 24c. The sensor circuit 204 receives line signals from on the phase A, B and C power lines 24a, 24b and 24c. The current sensors 201a, 201b and 201c generate current measurement signals from the received phase A, B and C line signals, and provide the current measurement signals to the A/D converter 214. The voltage sensors 203a, 203b and 203c generate voltage measurement signals from the received phase A, B and C line signals, and provide the voltage measurement signals to the ADC circuit 216.

The ADC circuit 216 receives the current measurement signals and generates digital current measurement signals therefrom. The ADC circuit 216 also receives the voltage measurement signals and generates digital voltage measurements signals therefrom. The ADC circuit 216 provides the digital voltage and current measurements signals to the DSP 218. The DSP 218 generates various energy measurement values, for example, accumulated real energy, from the digital voltage and current measurement signals. The DSP 218 also generates from the digital current measurement signals a current magnitude value for each phase. For example, the DSP 218 may generate per-phase RMS current values $IA_{rms}$, $IB_{rms}$, and $IC_{rms}$, respectively, for each of the phase A line 24a, the phase B line 24b, and the phase C line 24c. Methods of calculating various energy values from sampled voltage and current measurement waveforms are well known.

The DSP 218 causes display of one or more of the energy measurement values, such as accumulated real energy, on the display 212. The DSP 218 furthermore provides various values, including the per-phase RMS current values $IA_{rms}$, $IB_{rms}$, and $IC_{rms}$, to the processing device 224.

The magnetic sensor 230 senses the magnetic field within the meter 200 in an ongoing manner and generates a sensor signal representative thereof. The RF filter 232 filters out any frequencies of the sensor signal that exceed 20 kHz. The RF filter 232 provides the filtered sensor signal to the interrupt circuit 222 and the ADC circuit 220. The interrupt circuit 222 is programmed or configured such that when the filtered sensor signal has a magnitude or level that exceeds a level associated with the first threshold (e.g. 10 Gauss), then the interrupt circuit 222 generates an interrupt signal and provides the interrupt signal to the processing device 224. Otherwise, the interrupt circuit 222 does not generate an output signal. It will be appreciated that in a processing device that does not have a programmable or configurable interrupt circuit or input, the RF filter 232 may be connected to the interrupt input via appropriate level conversion circuit elements, such as voltage dividers and/or amplifiers. In any event, the ADC circuit 220 also receives the filtered sensor signal and generates a digital version thereof, which is provided to the processing device 224.

The processing device 224 in at least some embodiments receives the energy consumption information from the DSP 218 and further processes the energy measurement values to generate power quality information and/or store load profiling information in the memory 208. The processing device 224 further controls various operations, such as the transmission of metering values using the transmitter 210, and those that store energy consumption and other values in the non-volatile memory 208.

The processing device 224 is further configured to detect magnetic tampering, or other magnetic abnormalities, using the per-phase RMS current values $IA_{rms}$, $IB_{rms}$, and $IC_{rms}$ received from the DSP 218, and using the digitized magnetic sensor values from the magnetic sensor circuit 214. To this end, the processing device 224 performs the operations shown in FIG. 3.

Figure 3:
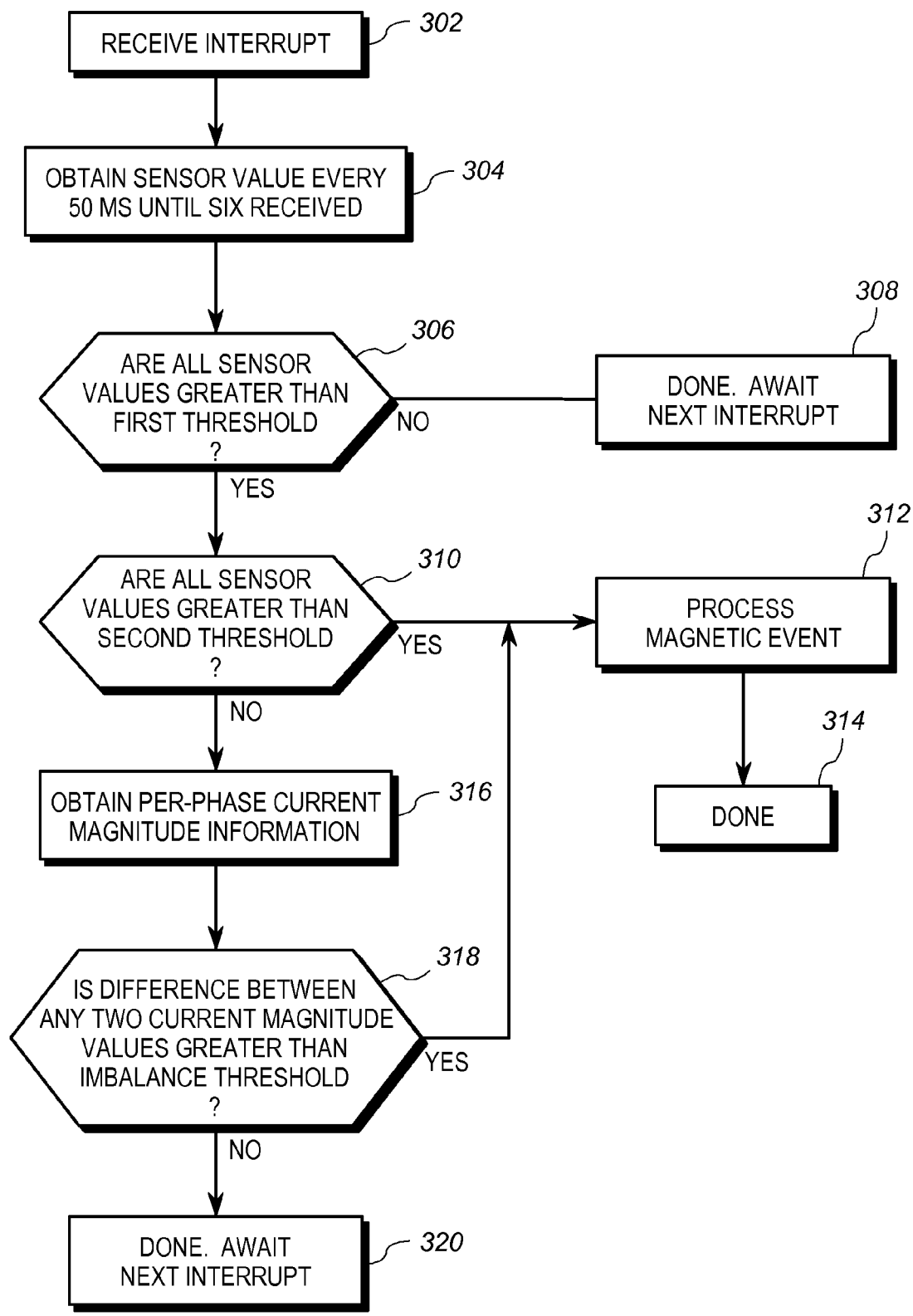
FIG. 3 shows a flow diagram of the operations of a processing device of the meter of FIG. 2.

In particular, FIG. 3 shows a flow diagram of an exemplary set of operations that may be performed by the processing device 224 to detect and record a magnetic event in a meter 200 that could indicate tampering.

In general, the operations of FIG. 3 are only performed upon receipt of an interrupt signal from the interrupt circuit 222. The processing device 224 otherwise performs other metering applications and functions within the meter 200, which are not represented in FIG. 3.

Accordingly, when the magnetic sensor circuit 214 detects a suitably high magnetic field, the processing device 224 receives the interrupt signal from the interrupt circuit 222 in step 302. The receipt of the interrupt signal indicates that magnetic field within the meter 200 has exceeded the first threshold. After receiving the interrupt signal in step 302, the processing device 224 proceeds to step 304.

In step 304, the processing device 224 obtains a plurality of digital sensor signals from the magnetic sensor circuit 214 over a predetermined time period. In this embodiment, the processing device 224 obtains a digital sensor signal sample every 50 milliseconds until six samples have been received. However, it will be appreciated that fewer or more samples may be obtained, so long as they are associated with a defined first time period of preferably less than one second. The six samples are referred to herebelow as magnetic sensor values. After performing step 304, the processing device 224 proceeds step 306.

In step 306, the processing device 224 determines whether all six magnetic sensor values are greater than the first threshold. As discussed above, the first threshold is one that indicates that a magnetic field is present, but not necessarily one that is due to unauthorized magnetic tampering. If all six magnetic sensor values are greater than the first threshold, then the processing device proceeds to step 310. If not, then the processing device 224 proceeds to step 308 and ends the operations, thereafter awaiting the next interrupt.

As a result of step 308, the processing circuit 224 assures that at least six consecutive readings (time over approximate ¼ second) exceed the first threshold before further processing to determine a possible tampering condition. Such a precaution helps eliminate recording a false tampering event due to spurious sensor readings. This additional filtering, however, may be carried out in other ways.

In step 310, the processing device 224 determines whether all six values are greater than the second threshold. As discussed above, the second threshold that corresponds to a magnetic field that exceeds that which could likely be associated with a legitimate magnetic device use. The second threshold is significantly higher than the first threshold, for example, an order of magnitude higher, such as 100 Gauss.

Thus, the second threshold is similar to that used in prior art systems that attempted to distinguish magnetic field tampering solely based on the magnetic field strength. If all six magnetic sensor values are greater than the second threshold, then the processing device 224 proceeds to identify perform processing steps associated with the determination of a tamper condition at step 312. Thus, if the magnetic field exceeds the higher second threshold, the processing device 224 determines the existence of a tampering event independent of, or in other words, without regard to measured load imbalance.

If all six magnetic sensor values are not greater than the second threshold, then the processing device 224 proceeds to step 316. Thus, the processing device 224 performs step 316 only in the condition where the detected magnetic field exceeds the lower first threshold, but not the second higher threshold. In accordance with the present invention, the processing device 224 in such a situation performs an additional step to determine whether an abnormal condition occurs that would indicate magnetic tampering. In this embodiment, the additional step is a determination of whether the measurements made by the meter's current sensors, i.e. current transformers (CTs), 201*a*, 201*b* and 201*c* indicate a load imbalance. A measured load imbalance in the presence of a magnetic field could indicate magnetic tampering for two reasons. Firstly, magnetic tampering is likely to cause an unequal amount of distortion in the CTs 201*a*, 201*b* and 201*c* because the magnet will be located more closely to one CT than the other(s). Thus, even though the actual customer load is not imbalanced, the measurements performed by the metrology circuit will indicate a load imbalance, due to saturation of the core of one of the CTs 201*a*, 201*b* or 201*c*. Secondly, the relatively moderate magnetic field created by a legitimate use of a magnet is typically not close enough to any of the current transformers 201*a*, 201*b*, 201*c* to cause significant, uneven, distortion that would result in a measured load imbalance.

Accordingly, in step 316, the processing device 224 obtains the per-phase current magnitude information at the current time period, which is substantially contemporaneous with the time that the six values were obtained in step 304. By contemporaneous, it is meant that the per-phase current magnitude information should be determined and/or measured within a few seconds or within a minute of the time when the six magnetic signal values are obtained in step 304, in order to assure that the load imbalance and the detected magnetic field are from the same event. However, because magnetic tampering is only effective if it is effectuated over a significant amount of time, it can be acceptable if the per-phase current magnitude information is obtained with several minutes of the six values of step 304, if it is convenient to do so.

In any event, the per-phase current magnitude values may suitably be RMS current values for each phase, $IA_{rms}$, $IB_{rms}$, and $IC_{rms}$. As discussed above, the processing circuit 224 suitably obtains the values from the DSP 218. The DSP 218 in many cases is otherwise configured to generate per-phase RMS current values as part of its other energy and metering calculations. Such calculations are known. For example, one may calculate RMS current from several 60 Hz cycles' worth of current samples received from the ADC circuit 216 using any conventional technique. Once the per-phase current magnitude values $IA_{rms}$, $IB_{rms}$, and $IC_{rms}$ are obtained, the processing device 224 proceeds to step 318.

In step 318, the processing device 224 determines whether any two of the per-phase magnitude values differ by more than a predetermined amount or percentage. If any two of the per-phase current magnitude values differ by more than a predetermined amount, then the metrology circuit 205 has measured a load imbalance among the power lines 24*a*, 24*b* and 24*c*. In the presence of the magnetic field detected in step 306, this measured load imbalance is assumed to have been caused by the unequal effects of the magnetic field of an unauthorized magnetic device on the CTs 201*a*, 201*b* and 201*c*, and thus indicating magnetic tampering. If the difference between any two of the per-phase current magnitude values $IA_{rms}$, $IB_{rms}$, and $IC_{rms}$ exceeds the predetermined imbalance threshold, then the processing device 224 proceeds to step 312. If not, however, then the processing device 224 proceeds to step 320 and ends the operations, thereafter awaiting the next interrupt.

Thus, if the magnetic sensor values exceed the first threshold, but there is no measured load imbalance, the processing device 224 does not record, display or communicate unauthorized or abnormal magnetic activity.

In the embodiment described herein, the predetermined threshold of step 318 is 20%, or 0.2. As discussed above, if the difference between any two is at least this amount, then the condition is satisfied. Thus, if any of the following statements are true:

$$\frac{IA_{rms} - IB_{rms}}{IA_{rms}} > 0.2$$

$$\frac{IB_{rms} - IC_{rms}}{IB_{rms}} > 0.2$$

$$\frac{IC_{rms} - IA_{rms}}{IC_{rms}} > 0.2$$

then the processing device 224 in step 318 would proceed to step 312 to process a tampering event. Otherwise, the processing device 224 proceeds to step 320 as discussed above. It will further be appreciated that in implementations of a single phase electrical service with two current measurements, the imbalance or difference threshold may be higher, for example, on the order of 40% or 0.4.

In step 312, the processing device 224 performs at least one operation related to the detection of a magnetic event that could be a tampering attempt. The conditions leading to step 312—either the magnetic field exceeding the higher second threshold, or a combination of a lower magnetic field and a measured load imbalance—indicate that a magnetic field is likely creating error in the electricity measurements in the meter 200. While the cause of such error is most often due to the placement of a permanent magnet on or near the meter for the purpose of tampering with the meter, it is possible that the cause is completely unintentional. In either event, it is useful to know of the magnetic event so that corrective action can be taken to ensure future metering accuracy.

Accordingly, in step 312, the processing device 224 sets a magnetic event flag that is stored within the processing device 224 memory, the non-volatile memory 208, or both. The processing device 224 may further record in such memory(ies) a time and date of the detected magnetic event based on the current time and date maintained from the meter's real-time clock. In some embodiments, the processing device 224 displays an indication of the magnetic event on the display 212, and may cause communication of a message indicating the magnetic event to a remote device, not shown, via the communication circuit 210.

These further processing steps can help provide timely and noticeable notification of the magnetic abnormality, and can further provide a record of its detection. The processing device 224 may then take other steps, depending on the implementation.

The embodiments described herein therefore determine potentially error-inducing magnetic events while in most cases distinguishing legitimate uses of magnetic elements near the meter. These features can be combined with other logic to further distinguish magnetic events from legitimate magnetic uses in and around the meter.

It will be appreciated that that the above-described embodiments are merely illustrative, and that those of ordinary skill in the art may readily devise their own implementations and modifications that incorporate the principles of the present invention and fall within the spirit and scope thereof.

I claim:

1. A method of detecting a magnetic coupling in a meter, comprising:
   a) obtaining in an electricity meter information representative of power consumption as measured within the meter of a plurality of lines of an electrical service;
   b) obtaining from a magnetic sensor information representative of a magnetic field within an electricity meter at a first time;
   c) determining in a processing circuit whether a first condition exists wherein the magnetic field exceeds a first threshold and the information representative of the power consumption indicates a load imbalance on the plurality of lines such that the load imbalance exceeds an imbalance threshold, wherein the information representative of the power consumption is representative of the power consumption within a predetermined amount of time from the first time; and
   d) performing a processing step responsive to a determination that the first condition exists, the first condition indicating that the magnetic field exceeding the first threshold and the load imbalance exceeding the imbalance threshold are caused by a same event.

2. The method of claim 1, wherein step a) further comprises obtaining a current magnitude measurement on each of the plurality of lines of the electrical service, and wherein the information representative of the power consumption comprises the current magnitude measurement on each of the plurality of lines; and step c) further comprises determining the load imbalance at least in part by comparing a value representative of the current measurement of one line of the electrical service with a value representative of the current measurement of another line of the electrical service.

3. The method of claim 1, wherein step a) further comprises obtaining the information representative of the power consumption on a plurality of phases of the electrical service.

4. The method of claim 1, wherein step b) further comprises obtaining the information representative of a magnetic field from a Hall-effect sensor.

5. The method of claim 1, wherein the first threshold is approximately 10 Gauss.

6. The method of claim 1, wherein the load imbalance comprises a percentage difference between power consumption on a first line of the electrical service and power consumption on a second line of the electrical service, and wherein the imbalance threshold is approximately 20%.

7. The method of claim 1, further comprising:
   e) determining in a processing circuit whether the magnetic field exceeds a second threshold; and
   f) performing a processing step responsive to a determination that the second condition exists independent of whether the information representative of the power consumption indicates a load imbalance on the plurality of lines.

8. The method of claim 1, wherein step c) further comprises determining whether the magnetic field exceeds the first threshold by:
   obtaining a plurality of magnetic field measurements within a first time period;
   determining that the magnetic field exceeds the first threshold if a predetermined number of the plurality of magnetic field measurements exceed the first threshold.

9. The method of claim 8 wherein the first time period is less than one second.

10. The method of claim 1, wherein the processing step comprises storing an indication of a tamper condition in a memory.

11. A circuit for use in an electricity meter, comprising:
    a metrology circuit configured to obtain information representative of a load on a plurality of lines of an electrical service;
    a magnetic sensor configured to provide information representative of a magnetic field within an electricity meter;
    a processing circuit operably coupled to the magnetic sensor, the processing circuit configured to:
    determine whether a first condition exists wherein the magnetic field exceeds a first threshold at a first time, and the information representative of the load indicates a load imbalance on the plurality of lines such that the load imbalance exceeds an imbalance threshold within a predetermined time from the first time; and
    perform a processing step responsive to a determination that the first condition exists the first condition indicating the magnetic field exceeding the first threshold and the load imbalance exceeding the imbalance threshold are caused by a single event.

12. The circuit of claim 11, wherein the metrology circuit includes a current sensor operably coupled to obtain a current measurement from each of the plurality of lines of the electrical service.

13. The circuit of claim 11, wherein the processing circuit forms a part of the metrology circuit.

14. The circuit of claim 13, wherein the metrology circuit is further configured to generate metering information representative of energy consumed by a load.

15. The circuit of claim 11, wherein the magnetic sensor comprises a Hall-effect sensor.

16. The circuit of claim 11, wherein the processing circuit further comprises an analog-to-digital converter operably coupled to receive a signal indicative of the magnetic field from the magnetic sensor.

17. The circuit of claim 11, wherein the processing circuit is further configured to:
    determine whether a second condition exists wherein the magnetic field exceeds a second threshold; and
    performing a processing step responsive to a determination that the second condition exists, independent of whether the information representative of the load indicates a load imbalance on the plurality of lines.

18. The circuit of claim 11, wherein the processing circuit is further configured to determine whether the magnetic field exceeds the first threshold by:
    obtaining a plurality of magnetic field measurements within a first time period;
    determining that the magnetic field exceeds the first threshold if a predetermined number of the plurality of magnetic field measurements exceed the first threshold.

19. The circuit of claim 18, further comprising an RF filter disposed between the magnetic sensor and the processing circuit.

20. The circuit of claim 11, wherein the processing circuit is further configured to store an indication of the tamper condition in a memory.

* * * * *